United States Patent
Tellkamp et al.

(10) Patent No.: US 7,044,304 B2
(45) Date of Patent: May 16, 2006

(54) ANTI-CORROSION OVERCOAT COVER TAPE

(75) Inventors: John P. Tellkamp, Sherman, TX (US); Clessie A. Troxtell, Jr., Howe, TX (US)

(73) Assignee: Texas Instruments Incorporated, Dallas, TX (US)

( * ) Notice: Subject to any disclaimer, the term of this patent is extended or adjusted under 35 U.S.C. 154(b) by 135 days.

(21) Appl. No.: 10/229,635

(22) Filed: Aug. 28, 2002

(65) Prior Publication Data

US 2004/0040886 A1    Mar. 4, 2004

(51) Int. Cl.
*B65D 85/90* (2006.01)

(52) U.S. Cl. .................. 206/714; 206/524.4

(58) Field of Classification Search ........ 206/713–714, 206/524.4, 715–717
See application file for complete search history.

(56) References Cited

U.S. PATENT DOCUMENTS

| | | | | |
|---|---|---|---|---|
| 4,736,841 A * | 4/1988 | Kaneko et al. | ............. | 206/714 |
| 5,532,025 A * | 7/1996 | Kinlen et al. | ............. | 252/500 |
| 5,658,649 A * | 8/1997 | Wrobleski et al. | ......... | 428/215 |
| 5,715,945 A * | 2/1998 | Chandler | ............. | 206/524.4 |
| 5,776,587 A * | 7/1998 | Angelopoulos et al. | .... | 428/209 |
| 5,875,897 A * | 3/1999 | Duncan et al. | ........... | 206/714 |
| 5,922,466 A * | 7/1999 | Angelopoulos et al. | .... | 428/418 |
| 5,958,115 A * | 9/1999 | Bottcher et al. | ......... | 106/14.05 |
| 6,194,777 B1 | 2/2001 | Abbott et al. | | |
| 6,246,446 B1 | 6/2001 | Heimbuch et al. | | |
| 6,467,627 B1 * | 10/2002 | Troxtell, Jr. | ............. | 206/714 |
| 6,823,652 B1 * | 11/2004 | Troxtell, Jr. | ............. | 53/427 |
| 2003/0049437 A1 * | 3/2003 | Devaney et al. | ........... | 206/714 |

* cited by examiner

*Primary Examiner*—Bryon P. Gehman
(74) *Attorney, Agent, or Firm*—Yingsheng Tung; Wade James Brady, III; Frederick J. Telecky, Jr.

(57) ABSTRACT

A flexible carrier tape system suitable for transporting and/or storing an electrical component, which has an exposed metal surface sensitive to corrosion. The system comprises a container having a corrosion inhibitor therein, which is capable of reacting with the metal to form a film as an electromechanical barrier against corrosive attack; a component is placed in the container.

In the preferred embodiment of the flexible carrier tape system, an elongated base strip has an upper surface and a plurality of longitudinally spaced cavities extending downwardly a predetermined depth from said upper surface for housing electrical components therein. A component in each of the cavities has at least one exposed metal surface sensitive to corrosion. An elongated cover strip for the upper base strip surface has a corrosion inhibitor deposited on that strip surface which faces the cavities. The cover strip is sealed onto the base strip so that it forms a substantially uniform plane with the upper surface, and a portion of said corrosion inhibitor is deposited onto the exposed metal surfaces. The inhibitor reacts with the metal surfaces to form a film of polymeric complex providing an electrochemical barrier against corrosive attack.

9 Claims, 1 Drawing Sheet

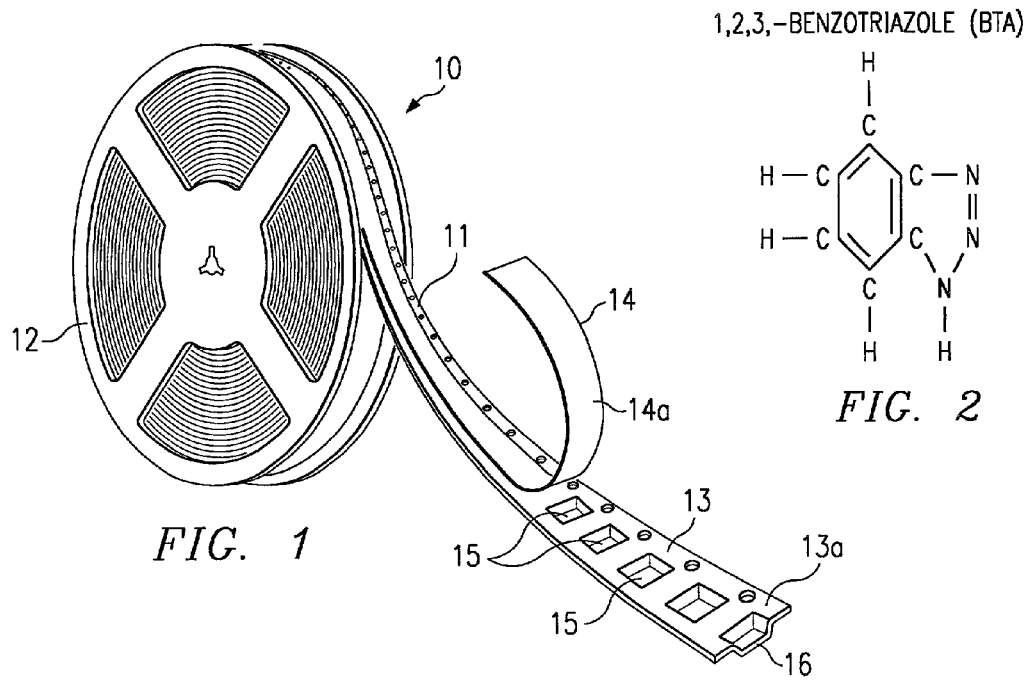
FIG. 1
FIG. 2
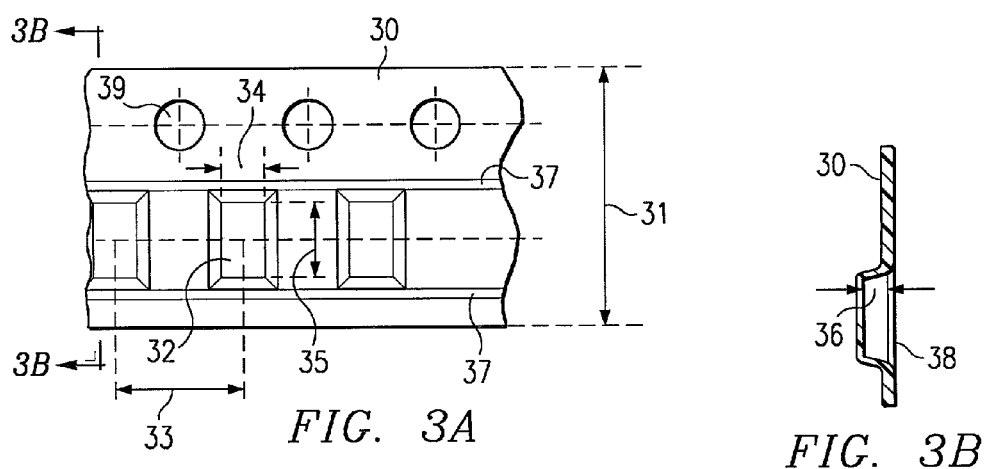
FIG. 3A
FIG. 3B
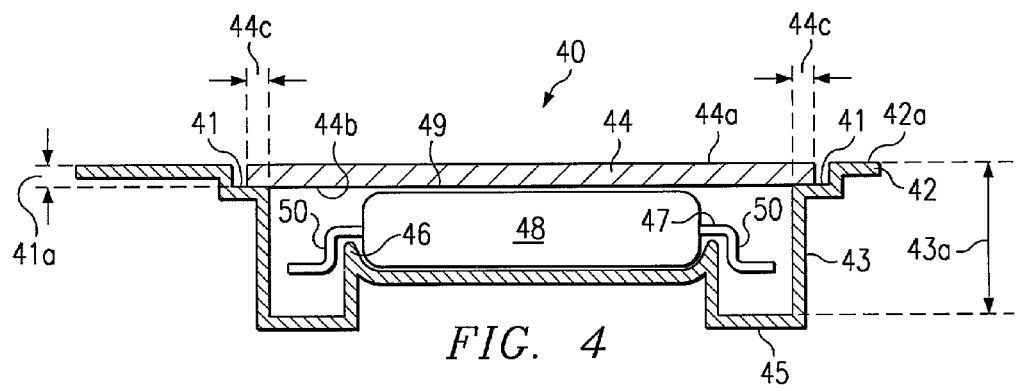
FIG. 4

ANTI-CORROSION OVERCOAT COVER TAPE

FIELD OF THE INVENTION

The present invention is related in general to the field of electronic systems and semiconductor devices and more specifically to a method of inhibiting copper corrosion of semiconductor devices by forming strong polymeric surface complexes during transportation.

DESCRIPTION OF THE RELATED ART

Corrosion has been a long-time problem for semiconductor products, with many victories for corrosion prevention, but also numerous new complications caused by new technology trends. For plastic encapsulated devices, the external parts of leads, lands, and solder parts have often been challenged by corrosion complications. For devices with copper leadframes, external corrosion has been brought under control by the palladium methods described in U.S. Pat. No. 6,246,446, issued 12 Jun. 2001 (Abbott, "Leadframes with Reduced Corrosion") and U.S. Pat. No. 6,194,777, issued 27 Feb. 2001 (Abbott, "Leadframes with Selective Palladium Plating"). A palladium-plated leadframe is introduced which is not subject to corrosion due to galvanic potential forces aiding the migration of the base metal ions to the top surface where they will form corrosion products. A sequence of layers is described consisting of nickel (over the base metal), palladium/nickel alloy, nickel, and palladium (outermost).

There are, however, leadframe designs which require that rails hold the outside leads in place until after completion of the plating steps, the integrated circuit chip assembly, and the packaging processes. When these rails are finally excised ("trimmed") by cutting, the areas of the cuts expose the underlying base metal, usually copper. Corrosion can then easily threaten these exposed spots, especially during device transportation and storage. There is no successful method in known technology to eliminate this risk of corrosion.

Some manufacturers have tried to ship electronic components in bags or other bulky containers which contain so-called "Vapor Corrosion Inhibitors" (VCI). However, semiconductor devices must be shipped with utmost care to prevent bending of the sensitive external leads and cannot be transported in bags where they may rattle against each other. Other trials were made with spray cans to cover exposed metal parts with corrosion inhibitors. The chemicals used were unsatisfactory or of short-lived effectiveness An urgent need has therefore arisen for a coherent, low-cost method to eliminate the risk of device corrosion in transport and/or storage by protecting the exposed corrosion-sensitive metal areas. The method should be flexible enough to be applied for different semiconductor product families, should allow high density packing, and should achieve improvements toward the goal of long-term device reliability. Preferably, these innovations should fit right into the established process flow and should be accomplished using the installed equipment base so that no investment in new manufacturing machines is needed.

SUMMARY OF THE INVENTION

According to the present invention, a flexible carrier tape system is disclosed, which is suitable for transporting and/or storing an electrical component, which has an exposed metal surface sensitive to corrosion. The system comprises a container having a corrosion inhibitor therein, which is capable of reacting with the metal to form a film as an electromechanical barrier against corrosive attack; a component is placed in the container.

In the preferred embodiment of the flexible carrier tape system, an elongated base strip has an upper surface and a plurality of longitudinally spaced cavities extending downwardly a predetermined depth from said upper surface for housing electrical components therein. A component in each of the cavities has at least one exposed metal surface sensitive to corrosion. An elongated cover strip for the upper base strip surface has a corrosion inhibitor deposited on that strip surface which faces the cavities. The cover strip is sealed onto the base strip so that it forms a substantially uniform plane with the upper surface, and a portion of said corrosion inhibitor is deposited onto the exposed metal surfaces. The inhibitor reacts with the metal surfaces to form a film of polymeric complex providing an electrochemical barrier against corrosive attack.

The present invention is related to any type and size of product, which can be stored and delivered in cavities in plastic tapes. A prominent group of these products include electronic components and semiconductor devices. Among the semiconductor devices, components can be found in many integrated circuit families such as standard linear and logic products, processors, digital and analog devices, high frequency and high power devices, and both large and small area chip categories, which have small metal portions exposed so that they are sensitive to corrosion. The invention is equally useful to semiconductor manufacturers and device users, where devices may be transported and/or stored.

It is an aspect of the invention is to introduce transport and storage concepts for a wide variety of components which are flexible so that they can be applied to many product families, especially of electronic and semiconductor types, and are general so that they can be applied to several future generations of products.

Another aspect of the invention is to use the low-cost, high-speed process of spraying the inhibitor as a solution in polar solvents such as methanol, propanone, or ether onto the one surface of the cover tape, which will face the components enclosed in the cavities. The inhibitor crystallizes from the dried solution as a conglomerate of needle-like crystals with an average distribution thickness between 20 and 50 nm.

Another aspect of the invention is that the partial sublimation of the inhibitor crystals is an effect concurrent with the sealing of the cover tape onto the base strip at temperatures between 150 and 200° C. The distribution of the inhibitor is thus a side effect of a regular process step and is reached without equipment changes and using the installed fabrication equipment base.

The technical advances represented by the invention, as well as the aspects thereof, will become apparent from the following description of the preferred embodiments of the invention, when considered in conjunction with the invention.

BRIEF DESCRIPTION OF THE DRAWINGS

FIG. 1 is a schematic and simplified perspective view of a reel winding a flexible carrier tape including a base strip having cavities and a cover strip.

FIG. 2 depicts the chemical formula of benzotriazole (BTA).

FIG. 3A is a schematic top view of the embossed base strip of FIG. 1.

FIG. 3B is a cross sectional view of a cavity in the base strip for housing components.

FIG. 4 is a schematic and simplified cross section of a cavity in the base strip of the carrier tape according as an example of the preferred embodiment of the invention.

DETAILED DESCRIPTION OF THE PREFERRED EMBODIMENTS

The present invention is related to U.S. patent application Ser. No. 09/703,985, filed Oct. 30, 2000 (Troxtell, "High Density Tape Carrier System and Method of Operation"), which is herewith incorporated by reference.

A preferred embodiment of the invention, suitable for transporting and/or storing a wide variety of components, is shown in FIG. 1. It depicts a tape and reel configuration, generally designated 10, as commonly used in many industries for storage and transport of products from the manufacturer to the customer. The prominent example for this invention is the semiconductor industry. The tape and reel configuration is designed for feeding electronic components such as semiconductor devices to automatic placement machines in the customer house for board assemblies. Commonly, surface mount technology is employed; consequently, the tape is designed to be suitable for surface mount semiconductor packages.

It should be pointed out, however, that the present invention is not limited to tape-and-reel transport and storage systems, but applies to any container suitable to the device under discussion.

Continuing in FIG. 1, a flexible carrier tape 11 is wound on a reel 12, preferably in high density. For most applications, the carrier tape 11 comprises an elongated base strip 13 and elongated cover strip 14. The cover strip is sealed to the base strip along the edges. In base strip 13, a plurality of cavities 15 is embossed, preferably equally spaced in longitudinal direction. Base strip 13 has an upper surface 13a; the cavities 15 extend downward from this upper surface 13a to a predetermined depth suitable for housing components such as semiconductor devices. The fact of the embossed cavities is indicated in FIG. 1 by the curved bending of tape wall 16.

The tape material suitable for the base strips of this invention is typically polystyrene or polystyrene laminate, preferably in a thickness range from about 0.2 to 0.4 mm (unformed film), dependent largely on the size and weight of the component to be carried by the tape. The cover strip may be the same material yet thinner, or another material selected such that the strip sealing temperature remains preferably in the range 150 to 200° C. These materials are commercially available from suppliers worldwide. In the USA, examples are the companies Advantek, ITW, Expotech and Martinez; in Japan, Dainippon and Shin Etsu; in Korea, SVM and Allkey; in Malaysia, C-Pak and ITW; in Singapore, Dou Yee and Sumicarrier; in the Philippines, ITW.

After the composite tape 11 is loaded with the components and sealed, it is wound onto reel 12. The reel is placed into a corrugated shipping box for transport and delivery.

The cover strip 14 has a surface 14a which faces the cavities 15. The corrosion inhibitor is deposited on surface 14a. The composition of the corrosion inhibitor, and its deposition method onto surface 14a, depend on the exposed metal on the device-to-be-transported. In the preferred embodiment of the invention, the devices-to-be-transported are semiconductor components. Frequently, the metal at risk of corrosion is copper or copper-based alloys, since copper or copper alloys are typically used as the base metal of leadframes or in other contact "land" needed for surface mount assembly. Preferred corrosion inhibitors for copper include 1,2,3-benzotriazole, abbreviated BTA; and 1-H-4,5 tolyltriazole, abbreviated TTA.

These chemicals are commercially available, for instance, from Cortec Corporation, St. Paul, Minn.; BTA is available under the trademark G-6. Another commercial source is Jiangnan Fine Chemical Factory, Lihe Town, Changzhou, Ziangsu, China 213145.

The chemical formula for benzotriazole (or azimidobenzene) is C6H5N3, or more descriptively the symbol reproduced in FIG. 2. BTA can be applied in aqueous solution or solved in polar solvents such as methanol, propanone, or ether. Sublimation temperature 98 to 100° C.

The preferred method of depositing BTA onto surface 14a in FIG. 1 is by spraying a solution containing BTA. Another method is fogging an aerosol containing BTA. The liquids deposited onto surface 14a are then dried, and BTA crystallizes in form of microscopic needles and particles, forming a conglomerate with an average distribution in the thickness range from 20 to 50 nm. An analogous spraying or fogging method is used for depositing TTA.

The elongated cover strip 14 is sealed to the elongated base strip 13 by laying surface 14a of cover strip 14 on surface 13a of base strip 13 so that cover strip 13 rests in step-like grooves around the cavities in base strip 13 (see below). The cover strip 14 forms then a substantially uniform plane with upper surface 13a of the base strip. The joint area is heated to temperatures between 150 and 200° C., whereby a portion of the deposited corrosion inhibitor is sublimated (sublimation temperature 98 to 100° C.) and deposited into the exposed metal surfaces of the devices stored in the cavities. BTA, or TTA, reacts with surface metal oxide to form a strong, insoluble polymeric complex. In the preferred embodiment, this metal oxide is copper oxide. This complex creates a protective film on the metal (copper) surface, about 10 to 20 molecules thick, and may contain ions of the metal to be protected. This film provides both a mechanical and electrochemical barrier against corrosive attack. Further, this film has a high degree of thermal and oxidative stability and cannot be easily removed.

For an example of a preferred design of the base strip, FIGS. 3A and 3B illustrate the base strip 13 of carrier tape 11 (FIG. 1) in more detail. FIG. 3A shows in top view base strip 30 having width 31. Embossed in base strip 30 is a plurality of cavities 32. They are preferably uniformly spaced by pitch 33 in longitudinal direction. Each cavity is characterized by length 34 and width 35. For square shaped cavities, length 34 and width 35 have the same dimensions; for round cavities, a diameter is substituted for length and width. Holes 39 are needed to index the carrier tape in the pick-and-place machines in the end-user's assembly line.

FIG. 3B is created by cross sectioning one of the cavities in FIG. 3A along line "3B—3B". The figure illustrates the depth 36 of the cavity. The cavity is shown in FIG. 3B in schematic manner, having a flat bottom wall and sidewalls substantially with only small inclination. As FIG. 4 shows in more detail, however, the bottom wall may have a plurality of ridges for engaging the stored components.

For precise aligning of the cover strip with the base strip, the base strip has grooves 37 (FIG. 3A). These grooves have a step-like configuration, as shown in more detail in FIG. 4, and serve to support the cover strip (designated 38 in FIG.

3B) for the sealing operation. The grooves extend continuously from one cavity to the next along the whole length of the carrier tape.

As the schematic cross section of the example of a carrier tape cavity, generally designated 40 in FIG. 4, indicates, the step-like grooves 41 are near the surface 42a of the base strip 42 forming the cavity. The grooves surround, at least partially, the cavity and are located where the cavity side walls 43 meet with surface 42a. The purpose of the grooves is to offer a secure location for resting the cover tape 44. This means that the depth 41a of the grooves has to be sufficient for the thickness of cover tape 44 (typically between 0.2 and 0.4 mm). The cover tape can then be placed so that its surface 44a, facing away from stored device 48, forms a substantially uniform plane with the upper surface 42a of the base strip.

The surface 44b of the cover tape 44, facing the stored device 48, carries the conglomerate of crystallized corrosion inhibitor polymer, preferably BTA or TTA. The heat, which needs to be applied, when the outer portions/edges 44c of cover tape 44 are sealed with grooves 41, is sufficient to sublimate at least a major portion of the BTA or TTA conglomerate. As described above, the corrosion inhibitor molecules are deposited on the exposed metal surfaces of the stored device, for instance on surfaces 50 of the external metal leads. The inhibitor forms complexes with metal or metal oxide surface atoms, which constitute a stable film for protection against corrosion.

The example of FIG. 4 further illustrates that the bottom wall 45 of the cavity has a plurality of ridges 46 disposed in the bottom portion of the cavity. They serve to engage peripheral portions 47 of the components 48, stored in the cavity, at predetermined lateral positions within the cavity. FIG. 4 shows that a small distance 49 remains as a gap between the surface of the stored component 48 and the cover strip 44. This distance 49 insures that the whole inhibitor-covered surface 44b can participate in the sublimation process. The total depth 43a of the cavity is predetermined to house component 48 in the cavity which rests on the ridges 46.

Considering FIG. 1 as well as FIG. 4, the fabrication process to complete a flexible carrier tape system comprises the steps of:

providing an elongated base strip 13 having an upper surface 13a and a plurality of longitudinally spaced cavities 15 extending downwardly a predetermined depth from upper surface 13a for housing electrical components 48 therein, each cavity 15 having a side wall 43 and a step-like groove 41 near surface 13a around cavity 15;

placing a component 48 in each of the cavities 15, the component 48 having at least one exposed metal surface 50 sensitive to corrosion;

providing an elongated cover strip 14 (or 44) for the upper base strip surface 41, the cover strip 14 having a width matching the width of the cavity 15 including the widths of the grooves 41;

depositing a corrosion inhibitor on that cover strip surface 14a (or 44b) which is intended to face the cavities 15; the corrosion inhibitor has a conglomerate of needle-like crystals with an average distribution in the thickness range from 20 to 50 nm;

placing cover strip 14 over upper base strip surface 13a; and sealing cover strip 14 onto base strip 13 at elevated elevated temperatures (between 150 and 200° C.) so that cover strip 14 rests in the step-like grooves 41 around cavities 15 and forms a substantially uniform plane with upper surface 13a, while concurrently a portion of the corrosion inhibitor sublimates and is deposited onto the exposed metal surfaces 50, reacting with these metal surfaces to form a film of polymeric complex providing an electrochemical barrier against corrosive attack.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the material of the semiconductor chip in the electronic components may comprise silicon, silicon germanium, gallium arsenide, or any other semiconductor material used in manufacturing. As another example, the ridges supporting the electronic component in the tape cavities may have a number of different shapes, including one or more holes in the plastic material.

As another example, the components stored and transported in the cavities may be different objects from cavity to cavity, or may originate from a variety of production realms. As another example, these different objects may have different corrosion-sensitive metal surfaces. Consequently, the corrosion inhibitor may a molecule different from BTA or TTA; or the deposited film may contain molecules of several inhibitors, each one aimed at specific metals. It is therefore intended that the appended claims encompass any such modifications or embodiments.

We claim:

1. A flexible carrier tape system comprising:
an elongated base strip having an upper surface and a plurality of longitudinally spaced cavities extending downwardly a predetermined depth from said upper surface for housing electrical components therein, each cavity having a sidewall and a groove near said surface around said cavity;
an elongated cover strip for said upper base strip surface, said cover strip having a width matching the width of said cavities;
a corrosion inhibitor deposited on that cover strip surface which faces said cavities; and
said cover strip sealed onto said base strip so that said cover strip rests around said cavities and forms a substantially uniform plane with said upper surface, and the deposited corrosion inhibitor on said sealed cover strip is capable of depositing onto exposed metal surfaces of electrical components contained in the cavities to form a polymeric complex.

2. The system according to claim 1 wherein said corrosion inhibitor is benzotriazole (1,2,3-benzotriazole or azimidobenzene, BTA, C6H5N3), or tolyltriazole (1-H-4,5 tolyltriazole, TTA).

3. The system according to claim 1 further including a reel for winding the tape, wherein said predetermined cavity depth exclusively defines the radial distance consumed by each tape winding on said reel.

4. The system according to claim 1 wherein said cavities have a form selected from a group consisting of cuboid, cubic, cylindrical and semispherical shape.

5. The system according to claim 1 wherein said base strip and said cover strip are made of a material selected from a group consisting of polystyrene, polystyrene laminate, or other polymers suitable for a sealing temperature between 150 and 200° C. and a thickness range from about 0.2 to 0.4 mm.

6. The system according to claim 1 wherein said film of polymeric complex is between 10 and 20 molecules thick and includes ions of the metal to be protected.

7. A method of completing a flexible carrier tape system, comprising the steps of:
provided an elongated base strip having an upper surface and a plurality of longitudinally spaced cavities extending downwardly a predetermined depth from said upper surface for housing electrical components therein, each cavity having a sidewall and a groove near said surface around said cavity;

placing a component in a cavity, said component having at least one exposed metal surface sensitive to corrosion;

providing an elongated cover strip for said upper base strip surface, said cover strip having a width matching the width of said cavity including the widths of said groove;

depositing a corrosion inhibitor on that cover strip surface which is intended to face said cavities;

placing said cover strip over said upper base strip surface; and sealing said cover strip onto said base strip at elevated temperatures so that said cover strip rests around said cavities and forms a substantially uniform plane with said upper surface, while concurrently a portion of said corrosion inhibitor sublimates and is deposited onto said exposed metal surfaces, reacting with said metal surfaces to form a film of polymeric complex providing an electrochemical barrier against corrosive attack.

8. The method according to claim 7 wherein said elevated sealing temperature is between 150 and 200° C.

9. The method according to claim 7 wherein said corrosion inhibitor is deposited on said cover strip surface by spraying, and allowed to dry and crystallize, forming a conglomerate of needle-shaped crystals having an average distribution in the thickness range from 20 to 50 nm.

* * * * *